United States Patent
Hsu et al.

(10) Patent No.: US 6,689,673 B1
(45) Date of Patent: Feb. 10, 2004

(54) METHOD FOR FORMING A GATE WITH METAL SILICIDE

(75) Inventors: Kirk Hsu, Hsin-Chu (TW); Yuang-Chang Lin, Feng-Yuan (TW); Wen-Jeng Lin, Pan-Chiao (TW)

(73) Assignee: United Microelectronics Corp., Hsin Chu (TW)

(*) Notice: Subject to any disclaimer, the term of this patent is extended or adjusted under 35 U.S.C. 154(b) by 0 days.

(21) Appl. No.: 09/572,150

(22) Filed: May 17, 2000

(51) Int. Cl.⁷ .............................................. H01L 21/76
(52) U.S. Cl. ........................ 438/572; 438/655; 438/682; 438/787; 438/791; 438/902
(58) Field of Search ................................ 438/592, 655, 438/682, 683, 787, 791, 902, 193

(56) References Cited

U.S. PATENT DOCUMENTS

| | | | | |
|---|---|---|---|---|
| 5,103,272 A | * | 4/1992 | Nishiyama | 257/388 |
| 5,739,066 A | * | 4/1998 | Pan | 438/595 |
| 5,994,183 A | * | 11/1999 | Huang et al. | 438/256 |
| 5,998,290 A | * | 12/1999 | Wu et al. | 438/595 |
| 6,001,719 A | * | 12/1999 | Cho et al. | 438/592 |
| 6,037,246 A | * | 3/2000 | Bhat et al. | 438/618 |
| 6,171,981 B1 | * | 1/2001 | Byun | 438/785 |
| 6,177,334 B1 | * | 1/2001 | Chen et al. | 438/584 |
| 6,187,676 B1 | * | 2/2001 | Kim et al. | 438/656 |
| 6,326,668 B1 | * | 12/2001 | Li | 257/384 |

* cited by examiner

*Primary Examiner*—Matthew Smith
*Assistant Examiner*—V. Yevsikov
(74) *Attorney, Agent, or Firm*—Dickinson Wright PLLC

(57) ABSTRACT

The proposed invention is related to a method for forming a gate with metal silicide. In short, the proposed method comprises the following steps: providing a substrate; forming a first dielectric layer on the substrate; forming a polysilicon layer on the first dielectric layer; forming a metal silicide layer on the polysilicon layer; forming a second dielectric layer on the metal silicide layer; etching the second dielectric layer, the metal silicide layer, the polysilicon layer and the first dielectric layer to form a gate; performing a thermal nitridation process to form a metal nitride layer on the sidewall of the metal silicide layer; and performing a thermal oxidation process to eliminate edge defects.

12 Claims, 6 Drawing Sheets

US 6,689,673 B1

METHOD FOR FORMING A GATE WITH METAL SILICIDE

BACKGROUND OF THE INVENTION

1. Field of the Invention

The proposed invention relates to a method for forming a gate with metal silicide and more particularly to a method that effectively eliminates gate edge leakage of the metal silicide gate.

2. Description of the Prior Art

In contemporary semiconductor technology, a gate usually is formed by the following process: as FIG. 1A shows, the formation of a dielectric layer 11 and conductor layer 12 on substrate 13 in sequence; as FIG. 1B shows, patterning the position of a gate by photoresist 14; and then as FIG. 1C shows, etching these layers to form the required gate and then the removal of photoresist 14.

Moreover, because some scars 15 are formed on the sidewall of the dielectric layer during the etching process, the quality of dielectric layer 11 is degraded and it is called a "gate edge defect." A popular method for dealing with this issue is to eliminate these scars 15 by performing an oxidation process after the etching process and before a spacer is formed. Obviously, the efficiency of the oxidation process is more enhanced when the dielectric layer 11 is an oxide layer.

However, when metal silicide is used to reduce resistivity and is formed as a part of gate, a new issue arises because the oxidation process not only repairs scars but also oxidates the metal silicide layers, and then resistivity of the metal silicide layer is increased. In other words, improvement of the dielectric layer accompanies degradation of the metal silicide layers, and then the degraded quality of the gate is unavoidable. In addition, because $TiSi_2$ is liable to be oxidated more than other popular metals silicide such as $CoSi_2$, $WSi_2$, $PtSi_2$, $MoSi_2$, $PtSi_2$ or $TaSi_2$, the issue is more serious when the metal silicide layer is a $TiSi_2$ layer.

In summary, it is desired to develop a new method that repairs scars without defalcation with the metal silicide layer being oxidated. Particularly, the new method is more important when the metal silicide layer is indispensable.

SUMMARY OF THE INVENTION

A principal object of the present invention is to provide a manufacturable method for forming a gate with a metal silicide.

Another object of the present invention is to provide a practical method that eliminates the edge defect without increased resistivity of a metal silicide.

A present preferred embodiment of the invention is a method for forming a gate with a metal silicide. In short, the proposed method comprises the following steps: providing a substrate; forming a first dielectric layer on the substrate; forming a polysilicon layer on the first dielectric layer; forming a metal silicide layer on the polysilicon layer; forming a second dielectric layer on the metal silicide layer; etching these layers to form a gate on the substrate; performing a thermal nitridation process to form a metal nitride layer on sidewall of the metal silicide layer; and performing a thermal oxidation process to eliminate the edge defect.

Another preferred embodiment is a re-oxidation process for a Ti-polycide gate. First, a substrate is provided; then, an oxide layer is formed, followed by the formation of polysilicon layer, a Ti-polycide layer and a silicon nitride layer on the substrate in sequence; and then etching a silicon nitride layer, a Ti-polycide layer, a polysilicon layer and an oxide layer to form a gate; next, a thermal nitridation process is performed to treat the gate; finally, a thermal oxidation process is performed to treat the gate.

In short, the nitridation process is the main characteristic of the invention. Herein, a metal nitride layer is formed on the sidewall of the metal silicide layer and then the remainder of the metal silicide layer is not affected by the following oxidation process.

BRIEF DESCRIPTION OF THE DRAWINGS

In the accompanying drawings forming a material part of this description, there is shown.

DESCRIPTION OF THE PREFERRED EMBODIMENT

To explain the invention in detail, some figures are used to illustrate the essential steps of the preferred embodiments of the invention and are discussed in the following paragraphs. One provided embodiment is a method for forming gate with metal silicide layer, and particularly, is a method that is not only easy to perform but also efficiently forms a gate only with lower resistivity metal silicide but without damage of edge defect effect. Another embodiment is the re-oxidation process for a Ti-polycide gate and is used to overcome the disadvantage of edge defect.

First of all, resistivity of the metal silicide layer is increased for the bare surface of the metal silicide layer that is oxidated and the sidewall of the metal silicide layer that is not covered by anything during the etching process of the conventional method. Therefore, the present invention relates to an essential way to let low resistivity of the metal silicide layer coexist with the elimination of the edge defect effect which thoroughly covers the bore sidewall of the metal silicide layer during the etching process.

Further, the present invention provides a method for forming a gate with a metal silicide layer as a preferred embodiment. The method proposes forming a gate not only with a low resistivity metal silicide layer but also without unexpected gate edge leakage. The essential steps of the method are illustrated in the following paragraph and with respect to FIG. 2A to FIG. 2E.

Figure 1A:
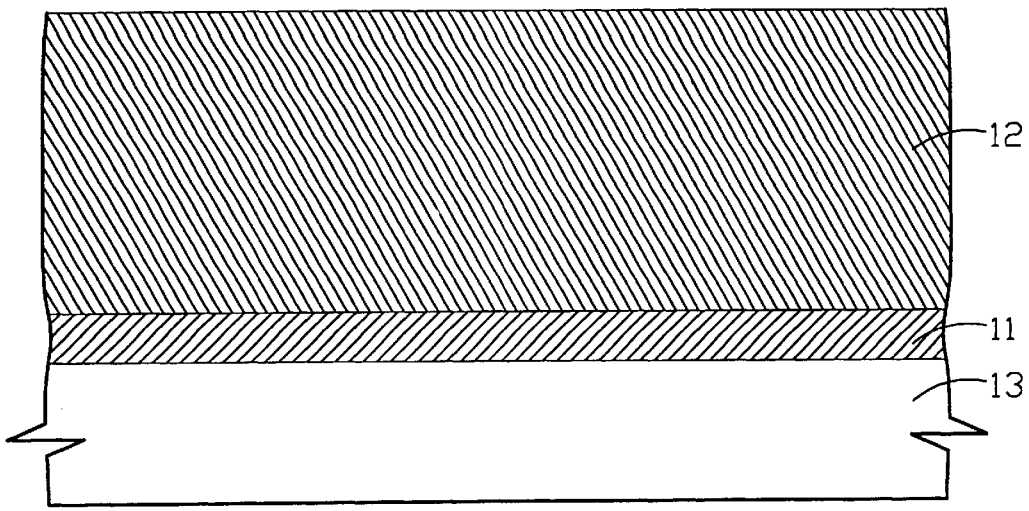
FIG. 1A to FIG. 1C are a series of qualitative cross-section illustrations of the conventional method for forming a gate with a metal silicide.
Figure 1B:
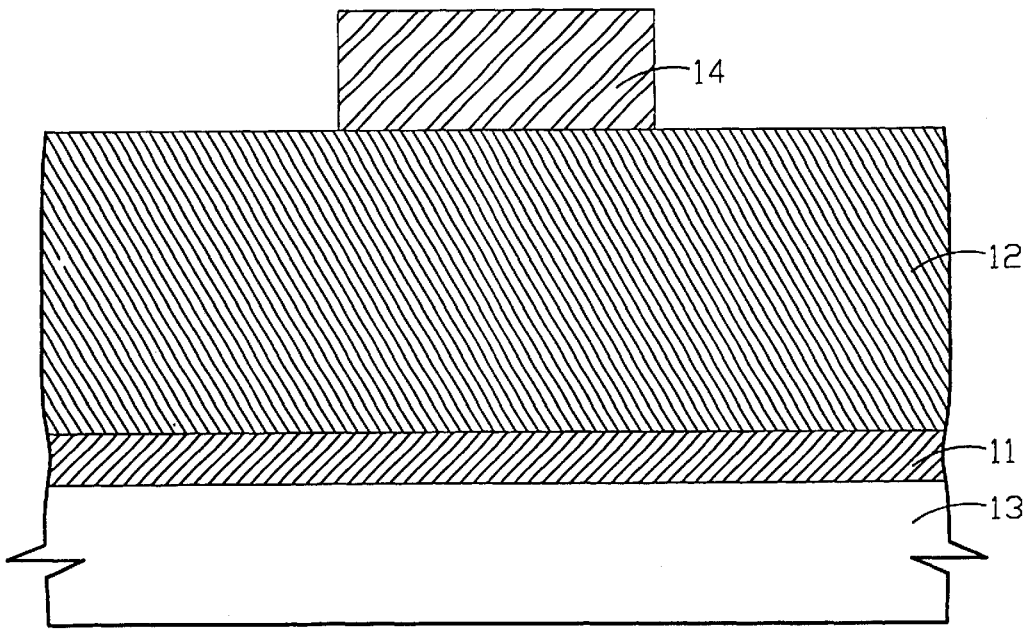
Figure 1C:
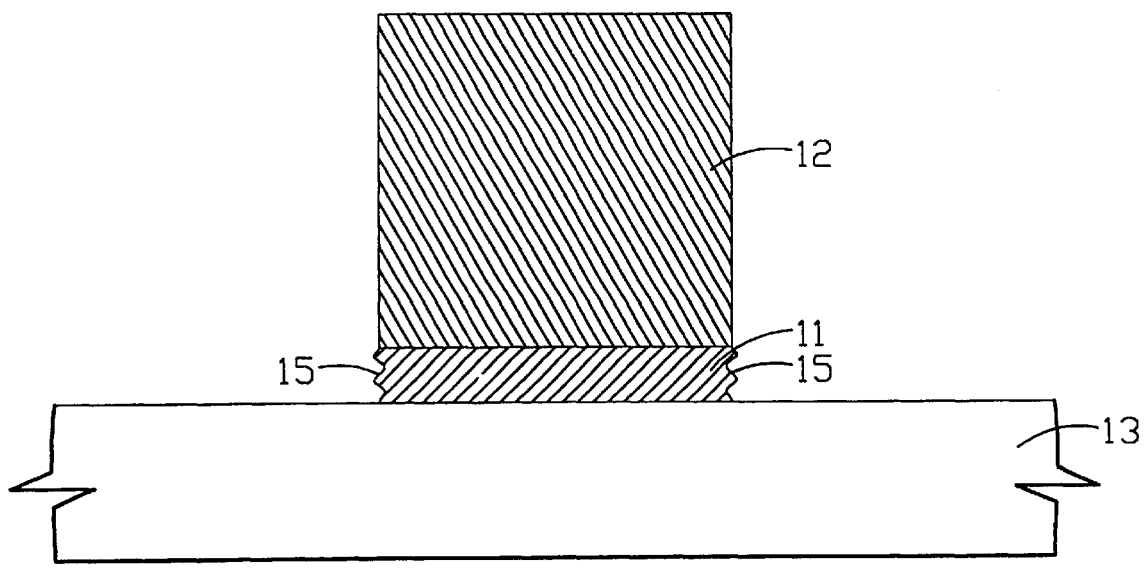
Figure 2A:
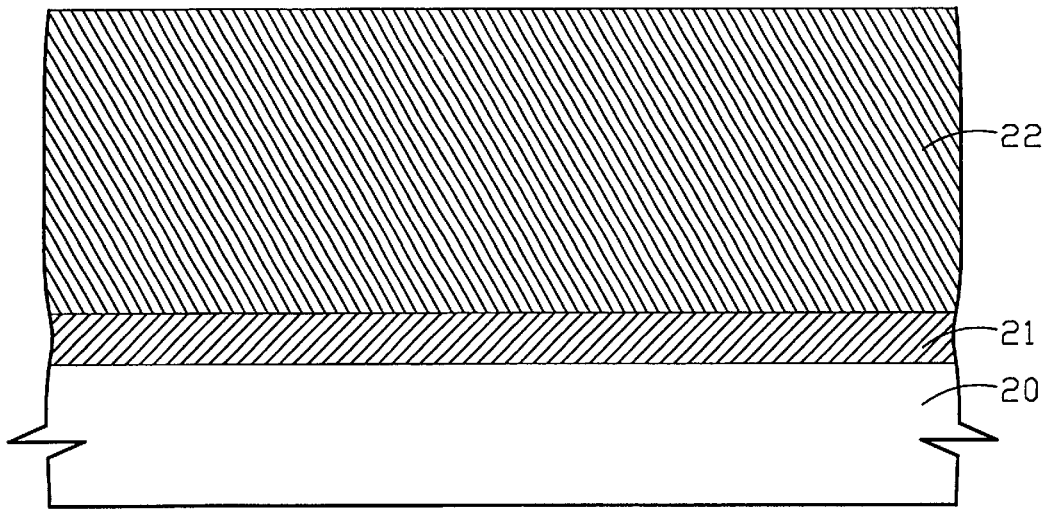
FIG. 2A to FIG. 2E are a series of qualitative cross-section illustrations of the essential steps of a preferred embodiment of the invention.

At the beginning, and referring to FIG. 2A, substrate 20 is provided which commonly comprises some structures in and on it, such as isolations and wells. First dielectric layer 21 is then formed followed by polysilicon layer 22 on substrate 20 in sequence. Where available varieties of first dielectric layer 21 comprise an oxide layer which can be formed by oxidating substrate 20 when the material of substrate 20 is silicon.

Figure 2B:
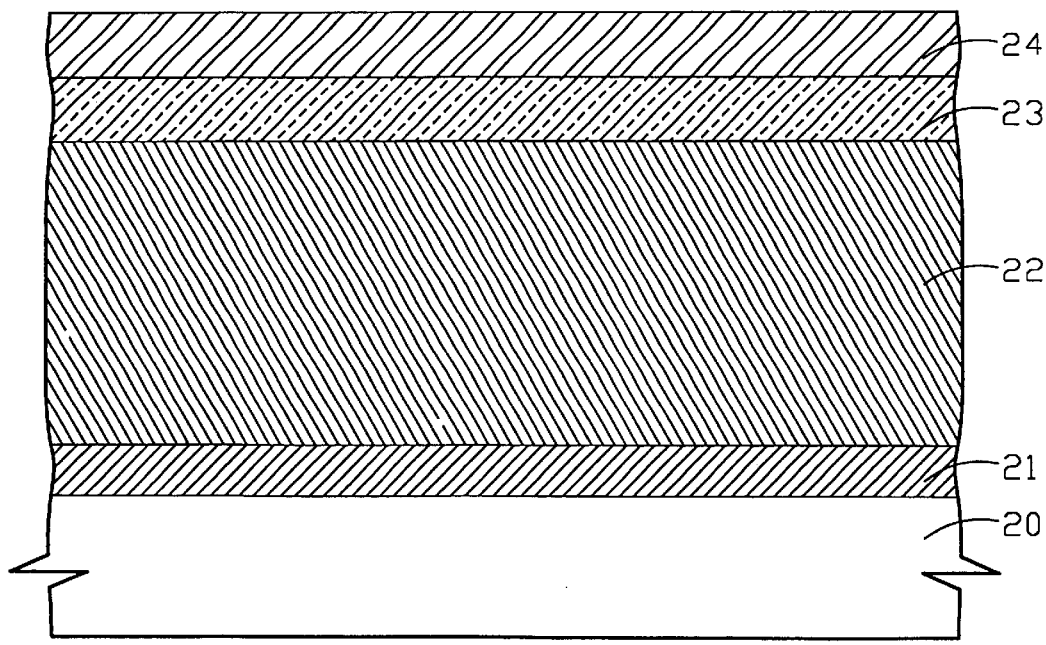

Next, as shown in FIG. 2B, metal silicide layer 23 is formed on polysilicon layer 22 and then second dielectric layer 24 is formed on metal silicide layer 23. Herein, metal silicide layer 23 and polysilicon layer 22 are regarded as a polycide layer as the combination of metal silicide layer 23 and polysilicon layer 22 behaves like the metal part of a transistor. Thus, metal silicide layer 23 can be called a metal-polycide layer, such as a Ti-polycide layer or a W-polycide layer. Besides, available varieties of metal silicide layer 23 at least include $TiSi_2$, $CoSi_2$, $WSi_2$, $PtSi_2$, $MoSi_2$, $PtSi_2$ or $TaSi_2$. Further, metal silicide 23 is usually formed by the following processes: first, forming a metal layer on polysilicon layer 22; and then, performing a heat treatment process to let the metal layer react with polysilicon layer 22 to form metal silicide layer 23. Besides, owing to the truth that second dielectric layer 24 usually is used to protect underlying layers, second dielectric layer 24 usually is a silicon nitride layer.

Figure 2C:
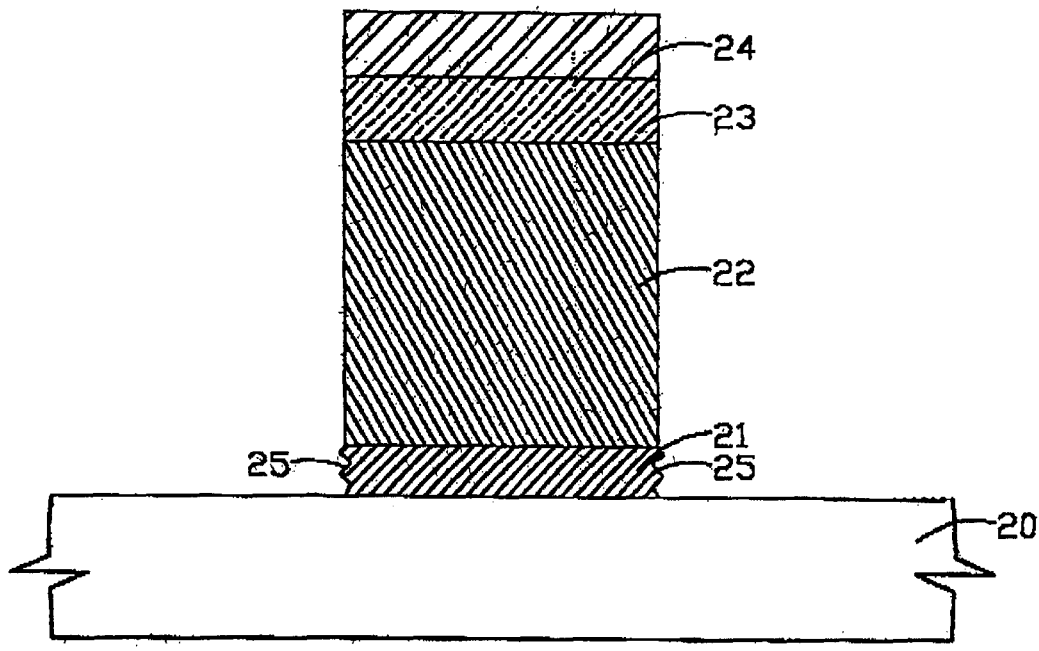

Then, as FIG. 2C shows, etching of second dielectric layer 24, metal silicide layer 23, polysilicon layer 22 and first dielectric layer 21 is undertaken to form a gate, wherein some scars 25 (the edge defect) occurs on the sidewall of first dielectric layer 22. Additionally, scars 25 are an unavoidable side effect of the etching process and then an obverse process to eliminate scars 25 is required.

Figure 2D:
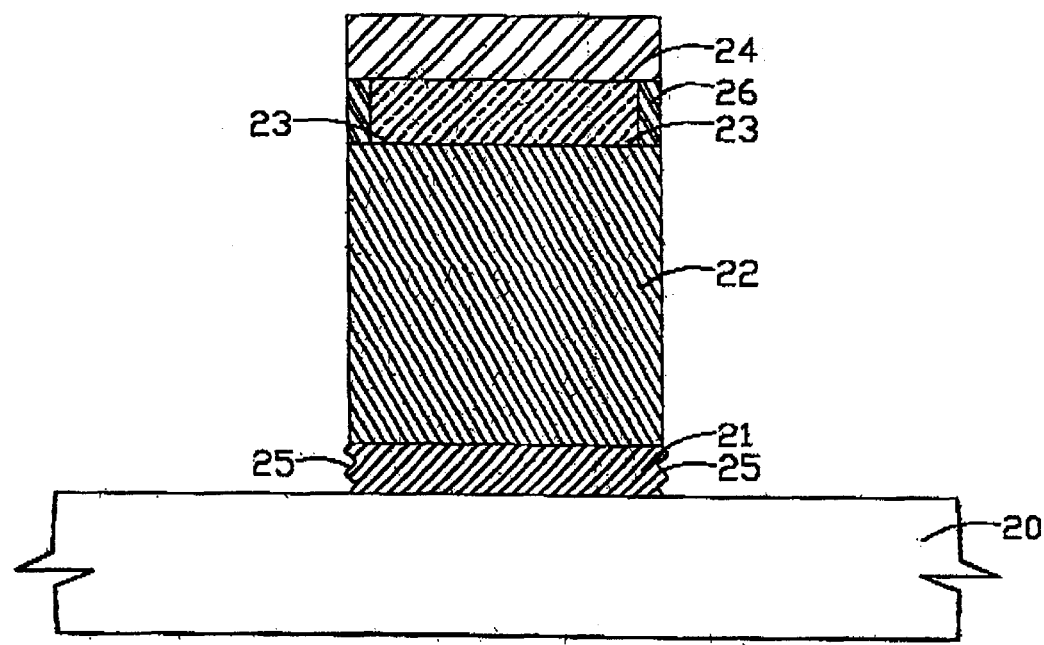

Thereafter, a thermal nitridation process is performed to form metal nitride layer 26 on the sidewall of metal silicide layer 23, as FIG. 2D shows, wherein the thickness of metal nitride layer 26 is about 100 angstroms to 500 angstroms. Further, a thermal nitridation process is performed under a nitrogen containing atmosphere. The temperature of the thermal nitridation process is about 750° C. to 950° C. and the period of the thermal nitridation process is about 30 seconds to 60 seconds.

Figure 2E:
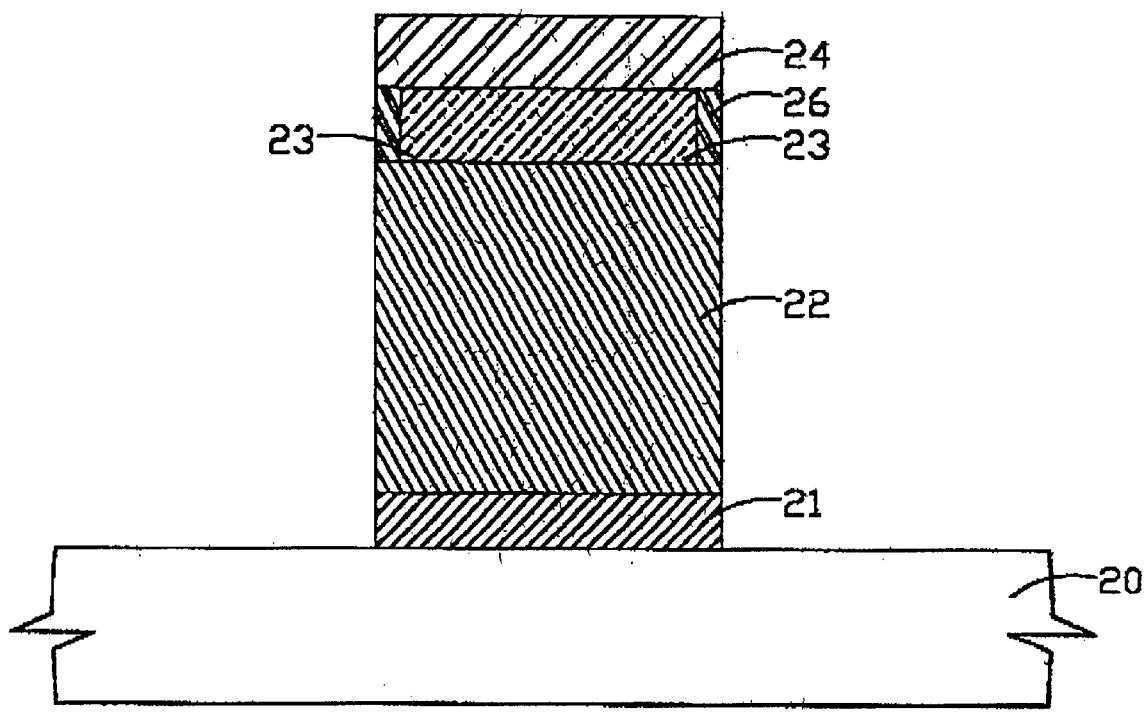

Finally, a thermal oxidation process is performed to eliminate edge defect, as shown in FIG. 2E. The thermal oxidation process is performed under an oxygen containing atmosphere. Moreover, the temperature of the thermal oxidation process is about 850° C. to 1000° C. and the period of the thermal oxidation process is about 30 seconds to 60 seconds.

Significantly, by comparing the present method with the conventional method, it is noted that the application of the nitridation process is one of the differences. The essential function of the nitridation process is to form metal nitride layer 26 on the sidewall (the bare surface) of the metal silicide layer 23, and then the remainder of the metal silicide layer 23 is not affected by the subsequent oxidation process. Thus, the resistivity of metal silicide layer 23 is not increased by the oxidation process and then a gate with only a lower resistivity metal silicide layer but without damage caused by the edge defect effect is formed by the proposed method.

Certainly, when quality of the gate is improved by the proposed method as discussed above, the quality of any element that includes the gate such as a transistor also is improved. Thus, the importance of the invention is significant because the gate is broadly used in contemporary semiconductor products.

Furthermore, it should be noticed that the only essential difference between the nitridation process and the oxidation process is that a different atmosphere is used. The former uses a nitrogen containing atmosphere but the latter uses an oxygen containing atmosphere. Besides, other differences such as temperature and time period are not prominent. Thus, the same equipment can be used to perform these processes in sequence. That is to say, not only is the flow of the proposed method similar to that of the conventional method but also the required equipment of the proposed method is equal to the required method of the conventional method. Thus, the proposed method is a manufacturable and practical method.

Figure 3:
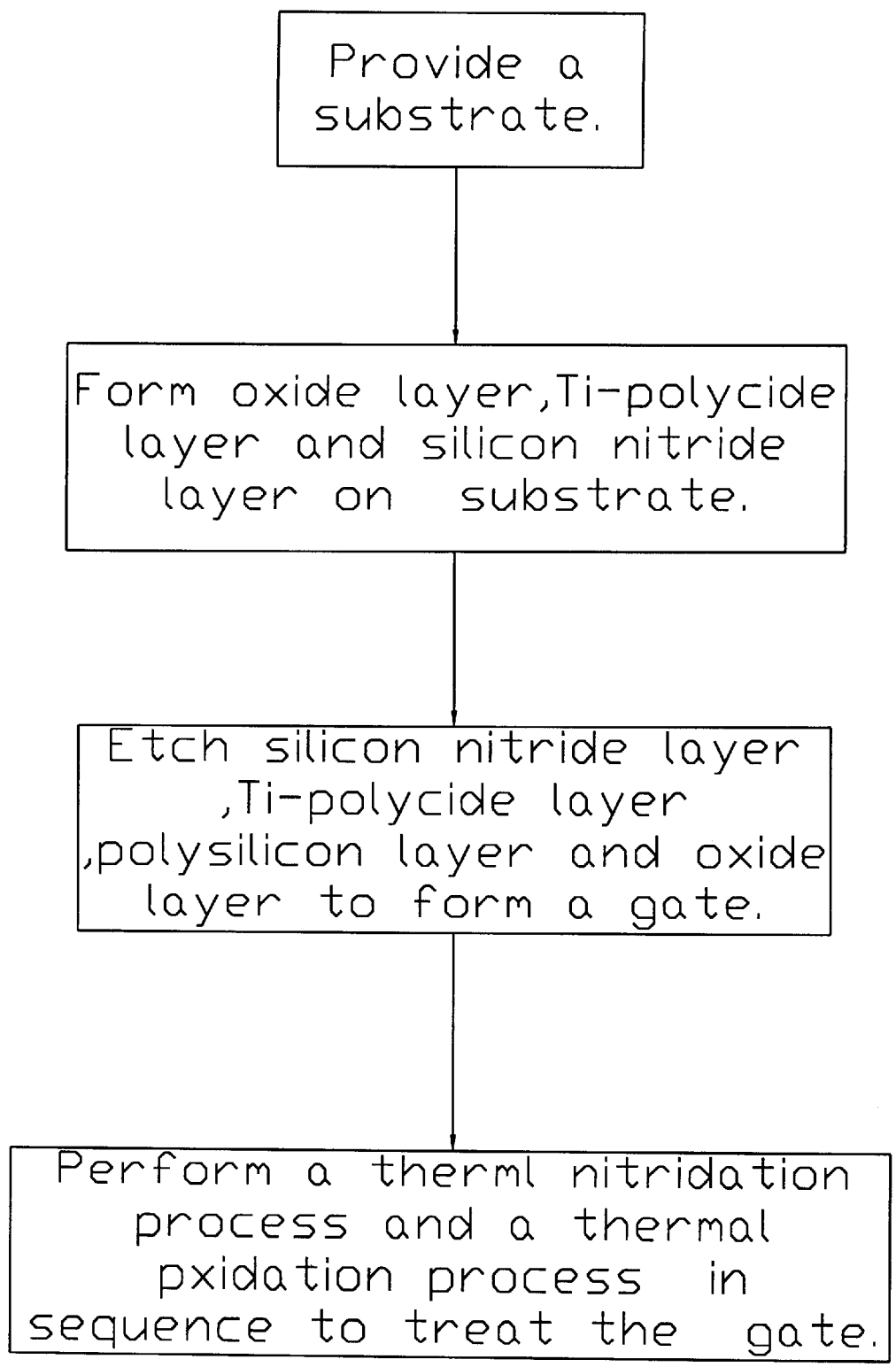
FIG. 3 is an essential flow chart of another preferred embodiment of the present invention.

Another preferred embodiment is a re-oxidation process for a Ti-polycide gate. Referring to FIG. 3, first, as substrate block 31 shows, a substrate is provided; next, as materials block 32 shows, an oxide layer, a polysilicon layer, a Ti-polycide layer and a silicon nitride layer are all formed on the substrate in sequence; then, as gate block 33 shows, the silicon nitride layer, the Ti-polycide layer, the polysilicon layer and the oxide layer are all etched to form a gate; finally, as treatment block 34 shows, a thermal nitridation process and a thermal oxidation process are performed in sequence to treat the gate.

In addition, the temperature of the thermal nitridation process is about 750° C. to 950° C. and the period of the thermal nitridation process is about 30 seconds to 60 seconds. Further, the temperature of the thermal oxidation process is about 850° C. to 1000° C. and the period of the thermal oxidation process is about 30 seconds to 60 seconds.

Although specific embodiments have been illustrated and described, it will be obvious to those skilled in the art that various modifications may be made without departing from what is intended to be limited solely by the appended claims.

What is claimed is:

1. A method for forming a gate with metal silicide, said method comprising following steps:

providing a substrate;

forming a first dielectric layer on said substrate;

forming a polysilicon layer on said first dielectric layer;

forming a metal silicide layer on said polysilicon layer;

forming a second dielectric layer on a surface of said metal silicide layer;

etching said second dielectric layer, said metal silicide layer, said polysilicon layer and said first dielectric layer to form a gate;

performing a thermal nitridation process to form a metal nitride layer on sidewall of said metal silicide layer, and not on said surface of said metal silicide layer; and performing a thermal oxidation process to treat said gate.

2. The method according to claim 1, wherein said first dielectric layer comprises oxide layer.

3. The method according to claim 1, wherein available varieties of said metal silicide layer is selected from the group consisting of TiSi2, CoSi2, WSi2, PtSi2, MoSi2, and TaSi2.

4. The method according to claim 1, wherein said second dielectric layer comprises silicon nitride layer.

5. The method according to claim 1, wherein temperature of said thermal nitridation process is about 750° C. to 950° C.

6. The method according to claim 1, wherein period of said thermal nitridation process is about 30 seconds to 60 seconds.

7. The method according to claim 1, wherein said thermal nitridation process is performed under a nitrogen containing atmosphere.

8. The method according to claim 1, wherein thickness of said metal nitride layer is about 100 angstroms to 500 angstroms.

9. The method according to claim 1, wherein temperature of said thermal oxidation process is about 850° C. to 1000° C.

10. The method according to claim 1, wherein period of said thermal oxidation process is about 30 seconds to 60 seconds.

11. The method according to claim 1, wherein said thermal oxidation process is performed under an oxygen containing atmosphere.

12. The method according to claim 1, wherein any edge effect on sidewall of said first dielectric layer is eliminated by said thermal oxidation process.

* * * * *